(12) United States Patent
Jia et al.

(10) Patent No.: US 12,349,555 B2
(45) Date of Patent: Jul. 1, 2025

(54) DISPLAY SUBSTRATE, METHOD FOR MANUFACTURING THE SAME, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Li Jia, Beijing (CN); Tao Gao, Beijing (CN); Zubin Lv, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 997 days.

(21) Appl. No.: 17/424,475

(22) PCT Filed: Jan. 11, 2021

(86) PCT No.: PCT/CN2021/071058
§ 371 (c)(1),
(2) Date: Jul. 20, 2021

(87) PCT Pub. No.: WO2021/143643
PCT Pub. Date: Jul. 22, 2021

(65) Prior Publication Data
US 2023/0157086 A1 May 18, 2023

(30) Foreign Application Priority Data
Jan. 17, 2020 (CN) .......................... 202010051632.6

(51) Int. Cl.
*H10K 59/124* (2023.01)
*H10K 50/80* (2023.01)
(Continued)

(52) U.S. Cl.
CPC ......... *H10K 59/124* (2023.02); *H10K 50/844* (2023.02); *H10K 59/1201* (2023.02);
(Continued)

(58) Field of Classification Search
CPC ..... H10K 71/00; H10K 50/844; H10K 59/873
See application file for complete search history.

(56) References Cited

U.S. PATENT DOCUMENTS

2017/0149014 A1* 5/2017 Choi ...................... H10K 59/12
2018/0294436 A1 10/2018 Choi et al.
(Continued)

FOREIGN PATENT DOCUMENTS

| CN | 108400152 A * | 8/2018 | ............. H01L 27/32 |
| CN | 109148525 A | 1/2019 | |

(Continued)

OTHER PUBLICATIONS

PCT/CN2021/071058 international search report and written opinion.
CN 202010051632.6 first office action.

Primary Examiner — Alia Sabur
(74) Attorney, Agent, or Firm — IPro, PLLC

(57) ABSTRACT

A display substrate, a method for manufacturing the display substrate and a display device are provided in this disclosure. The display substrate includes a substrate film layer and functional film layers, the display substrate includes a display region and a hole-forming region, and the method includes: forming a plurality of functional film layers on the substrate film layer; etching at least one of the functional film layers in the hole-forming region to form a first via-hole penetrating the at least one of the functional film layers; forming a transition layer that covers the display region and reveals the first via-hole; forming a second via-hole in the hole-forming region by using the transition layer as a mask, the second via-hole penetrating the substrate film layer and all the functional film layers apart from the at least one of the functional film layers; and removing the transition layer.

20 Claims, 7 Drawing Sheets

(51) Int. Cl.
*H10K 50/844* (2023.01)
*H10K 59/12* (2023.01)
*H10K 59/80* (2023.01)
*H10K 71/00* (2023.01)

(52) U.S. Cl.
CPC .......... *H10K 59/873* (2023.02); *H10K 71/00* (2023.02); *H10K 50/80* (2023.02); *H10K 59/80* (2023.02)

(56) References Cited

U.S. PATENT DOCUMENTS

| | | | |
|---|---|---|---|
| 2018/0342700 A1* | 11/2018 | Cai | H10K 50/8445 |
| 2019/0305252 A1 | 10/2019 | Dai et al. | |
| 2020/0106055 A1 | 4/2020 | Zhang | |
| 2020/0185466 A1* | 6/2020 | Xiang | H10K 71/00 |
| 2020/0212370 A1* | 7/2020 | Ye | H10K 59/60 |
| 2020/0295112 A1* | 9/2020 | Kim | H10K 50/844 |
| 2021/0043698 A1 | 2/2021 | Tan et al. | |
| 2021/0217993 A1* | 7/2021 | Yoon | H10K 59/873 |
| 2021/0359235 A1* | 11/2021 | Jiang | H10K 59/122 |
| 2024/0023365 A1* | 1/2024 | Choi | H10K 77/10 |

FOREIGN PATENT DOCUMENTS

| | | | | |
|---|---|---|---|---|
| CN | 109301085 A | | 2/2019 | |
| CN | 109671858 A | | 4/2019 | |
| CN | 110428740 A | | 11/2019 | |
| CN | 110491913 A | | 11/2019 | |
| CN | 110649177 A | * | 1/2020 | ......... H01L 27/3244 |
| CN | 111244142 A | | 6/2020 | |

* cited by examiner

DISPLAY SUBSTRATE, METHOD FOR MANUFACTURING THE SAME, AND DISPLAY DEVICE

CROSS-REFERENCE TO RELATED APPLICATION

This application is a U.S. national phase application of a PCT Application No. PCT/CN2021/071058 filed on Jan. 11, 2021, which claims priority to Chinese Patent Application No. 202010051632.6 filed on Jan. 17, 2020, the disclosures of which are incorporated in their entireties by reference herein.

TECHNICAL FIELD

The present disclosure relates to the field of display technology, in particular to a display substrate, a method for manufacturing the display substrate and a display device.

BACKGROUND

With continual development of electronic information technology, display devices (such as a smart phone, a tablet computer) find more and more application, and play an indispensable role in people's work and life. A display screen of the display device is evolving to have a large screen size and to become bezel-less. Generally, the display device (such as a mobile phone, a tablet computer) has a camera device (or an imaging device), and the camera device is usually arranged on a side outside the display region of the display screen. However, since the installation of the camera device requires certain installation location, it is difficult to provide the bezel-less screen or a narrow-bezel screen.

In the related art, in order to achieve a narrow bezel design and maximize the display region of the display screen, a hole is formed in the display region of the display screen to provide an installation location for the camera device, such that the camera device may be combined with the display region. However, in the related art, after the hole is formed in the display region, a material that cannot be removed remains in the hole, which hinders the installation of the camera device.

SUMMARY

A display substrate, a method for manufacturing the display substrate and a display device are provided in embodiments of the present disclosure.

In a first aspect, a method for manufacturing a display substrate is provided in an embodiment of the present disclosure. The display substrate includes a substrate film layer and functional film layers, the display substrate includes a display region and a hole-forming region, and the method includes: forming a plurality of functional film layers on the substrate film layer; etching at least one of the functional film layers in the hole-forming region to form a first via-hole penetrating the at least one of the functional film layers; forming a transition layer that covers the display region and reveals the first via-hole; forming a second via-hole in the hole-forming region by using the transition layer as a mask, the second via-hole penetrating the substrate film layer and all functional film layers apart from the at least one of the functional film layers; and removing the transition layer.

Further, the forming the transition layer that covers the display region and reveals the first via-hole includes: depositing a transition material layer covering the display region and the hole-forming region; applying a photoresist onto the transition material layer, exposing and developing the photoresist, to form a first photoresist pattern that covers the display region and reveals the first via-hole; etching the transition material layer in the hole-forming region by using the first photoresist pattern as a mask to form the transition layer that covers the display region and reveals the first via-hole; and removing the first photoresist pattern.

Further, the transition layer includes a metal layer or a metal oxide layer.

Further, the forming the plurality of functional film layers on the substrate film layer includes forming an anode on the substrate film layer; the forming the transition layer that covers the display region and reveals the first via-hole includes forming the transition layer that covers the display region and reveals the first via-hole, wherein the transition layer covers the anode; and the removing the transition layer includes etching off the transition layer by using a first etchant and leaving the anode intact.

Further, the material of the transition layer includes indium gallium zinc oxide, the material of the anode includes indium tin oxide, and the first etchant is a sulfuric acid solution.

Further, the forming the plurality of functional film layers on the substrate film layer includes: forming a planarization material layer on the substrate film layer; and forming a pixel insulation layer covering part of the planarization material layer in the display region. The etching at least one of the functional film layers in the hole-forming region to form the first via-hole penetrating the at least one of the functional film layers includes: applying a photoresist covering the pixel insulation layer and the planarization material layer, exposing and developing the photoresist, to form a second photoresist pattern revealing the hole-forming region; etching the planarization material layer by using the second photoresist pattern as a mask to form a planarization layer and a third via-hole penetrating the planarization layer; and removing the second photoresist pattern.

Further, the display substrate further includes a transition region between the display region and the hole-forming region, and prior to the forming the planarization material layer on the substrate film layer, the method further includes: forming a metal pattern on the substrate film layer, where the metal pattern includes a first metal layer and a second metal layer laminated one on another in a direction perpendicular to the substrate film layer, the second metal layer is located between the first metal layer and the substrate film layer, and the first metal layer and the second metal layer are made of different metal materials. The etching the planarization material layer by using the second photoresist pattern as the mask to form the planarization layer includes: etching the planarization material layer in the transition region by using the second photoresist pattern as a mask to form an annular via-hole penetrating the planarization layer, so as to reveal the metal pattern in the transition region, wherein the annular via hole surrounds the third via-hole and is connected to the third via-hole; and wet-etching the metal pattern in the transition region by using a second etchant to form an isolation pillar, wherein an etching rate of the second metal layer in the second etchant is larger than an etching rate of the first metal layer in the second etchant.

Further, prior to the forming the planarization material layer covering the display region and the hole-forming region, the method further includes: forming at least one of the functional film layers in the display region and the hole-forming region. Subsequent to the removing the second photoresist pattern, the method further includes: applying a photoresist covering the display region and the hole-forming region, exposing and developing the photoresist, to form a third photoresist pattern covering the display region and revealing the hole-forming region; etching the at least one of functional film layers in the hole-forming region by using the third photoresist pattern as a mask to form a fourth via-hole penetrating the at least one of functional film layers, wherein the fourth via-hole and the third via-hole are connected to each other and belong to the first via-hole; and removing the third photoresist pattern.

Further, the at least one of functional film layers includes at least one of a buffer layer, a light-shielding layer, an active layer, a gate insulation layer, a gate electrode pattern, an interlayer insulation layer, a metal layer or a passivation layer.

Further, the substrate film layer includes a barrier layer, and the etching the at least one of functional film layers in the hole-forming region by using the third photoresist pattern as the mask to form the fourth via-hole penetrating the at least one of functional film layers includes: etching all the functional film layers and part of the barrier layer in the hole-forming region by using the third photoresist pattern as a mask, to form the fourth via-hole.

Further, prior to the forming the planarization material layer covering the display region and the hole-forming region, the method further includes: forming the at least one of functional film layers in the display region and the hole-forming region, wherein, forming a target functional film layer includes: forming a material layer covering the display region and the hole-forming region; applying a photoresist onto the material layer, exposing and developing the photoresist, to form a fourth photoresist pattern revealing the hole-forming region; etching the material layer by using the fourth photoresist pattern as a mask to form a target display film layer revealing the hole-forming region, wherein the target display film layer is any one functional film layer of the at least one of the functional film layers.

Further, subsequent to the removing the transition layer, the method further includes: forming a light-emitting layer and a cathode sequentially; and peeling the display substrate from a carrying substrate.

Further, the display substrate further includes a peripheral region, the peripheral region surrounds the hole-forming region and the display region, and wiring connected to display elements in the display region is provided in the peripheral region.

Further, an orthographic projection of the first via-hole onto a plane where the substrate film layer is located overlaps an orthographic projection of the second via-hole onto the plane where the substrate film layer is located.

In a second aspect, a display substrate is further provided in an embodiment of the present disclosure. The display substrate includes a display region and a hole-forming region, the display substrate includes a substrate film layer and a display film layer including a plurality of functional film layers, the display substrate is provided with a first via-hole and a second via-hole, the first via-hole penetrates at least one of the functional film layers, the second via-hole penetrates the substrate film layer and all functional film layers apart from the at least one of the functional film layers, and an orthographic projection of the first via-hole onto a plane where the substrate film layer is located overlaps an orthographic projection of the second via-hole onto the plane where the substrate film layer is located.

Further, a size of a first opening of the second via-hole is larger than a size of a second opening of the second via-hole, and the size of the first opening of the second via-hole is a size of an opening at an end of the second via-hole close to the display film layer, and the size of the second opening of the second via-hole is a size of an opening at an end of the second via-hole away from the display film layer.

Further, the display film layer includes a planarization layer, and the first via-hole includes a third via-hole penetrating the planarization layer.

Further, the display film layer further includes other functional film layers between the planarization layer and the substrate film layer, and the first via-hole further includes a fourth via-hole penetrating at least one functional film layer of the other functional film layers.

Further, the substrate film layer includes a barrier layer, and the fourth via-hole penetrates the at least one functional film layer of the other functional film layers and part of the barrier layer.

Further, a depth of the fourth via-hole in a direction perpendicular to the substrate film layer is larger than a spacing distance between the barrier layer and the planarization layer.

Further, the display substrate further includes a transition region between the display region and the hole-forming region, and the planarization layer further includes an annular via-hole penetrating the planarization layer in the transition region, surrounding the third via-hole and being connected to the third via-hole, an isolation pillar is provided within the annular via-hole, the isolation pillar includes a first metal layer and a second metal layer laminated one on another in a direction perpendicular to the substrate film layer, the second metal layer is located between the first metal layer and the substrate film layer, and an orthographic projection of the second metal layer onto the substrate film layer is within an orthographic projection of the first metal layer onto the substrate film layer.

Further, the transition region is an annular region or a rectangular frame-shaped region.

Further, the display film layer includes at least one of a buffer layer, a light-shielding layer, an active layer, a gate insulation layer, a gate electrode pattern, an interlayer insulation layer, a metal layer or a passivation layer.

Further, the isolation pillar and the metal layer are located in a same layer and are made of a same material.

Further, the display film layer is composed of the plurality of functional film layers, and the orthographic projection of the first via-hole onto the plane where the substrate film layer is located is within the orthographic projection of the second via-hole onto the plane where the substrate film layer is located.

Further, the display substrate further includes a peripheral region surrounding the hole-forming region and the display region, and wiring connected to display elements in the display region is provided in the peripheral region.

In a third aspect, a display device including the above-mentioned display substrate is further provided in an embodiment of the present disclosure.

BRIEF DESCRIPTION OF THE DRAWINGS

In order to illustrate the technical solutions of the embodiments of the present disclosure in a clearer manner, the drawings required for the description of the embodiments of the present disclosure will be described hereinafter briefly. Obviously, the following drawings merely relate to some embodiments of the present disclosure, and based on these drawings, a person of ordinary skill in the art may obtain other drawings without any creative effort.

DETAILED DESCRIPTION

The technical solutions in the embodiments of the present disclosure will be described hereinafter clearly with reference to the drawings of the embodiments of the present disclosure. Obviously, the following embodiments merely relate to a part of, rather than all of, the embodiments of the present disclosure, and based on these embodiments, a person of ordinary skill in the art may, without any creative effort, obtain other embodiments, which also fall within the scope of the present disclosure.

Figure 1A:
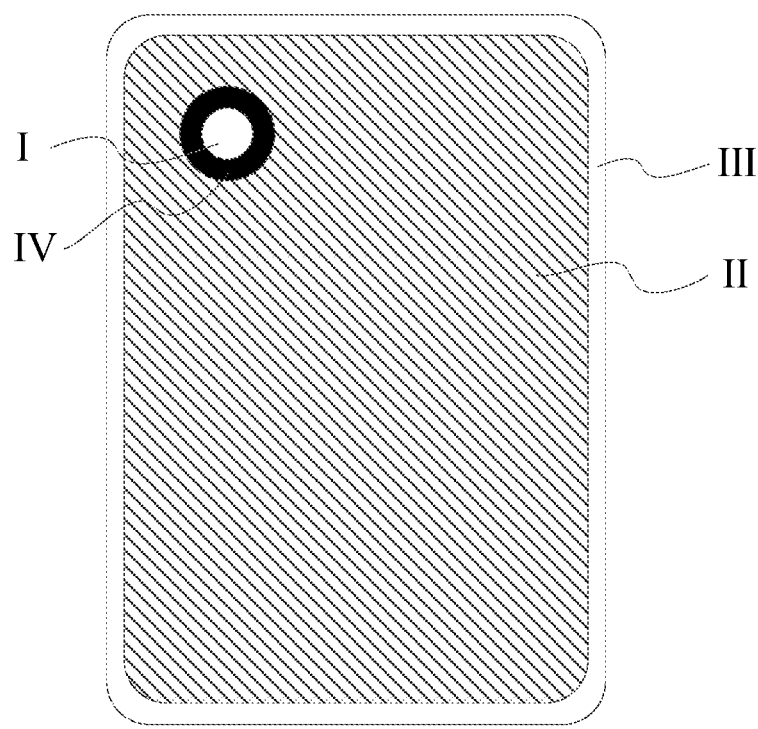
FIG. 1a is a schematic view showing positions of regions in a display substrate according to an embodiment of the present disclosure.
Figure 1B:
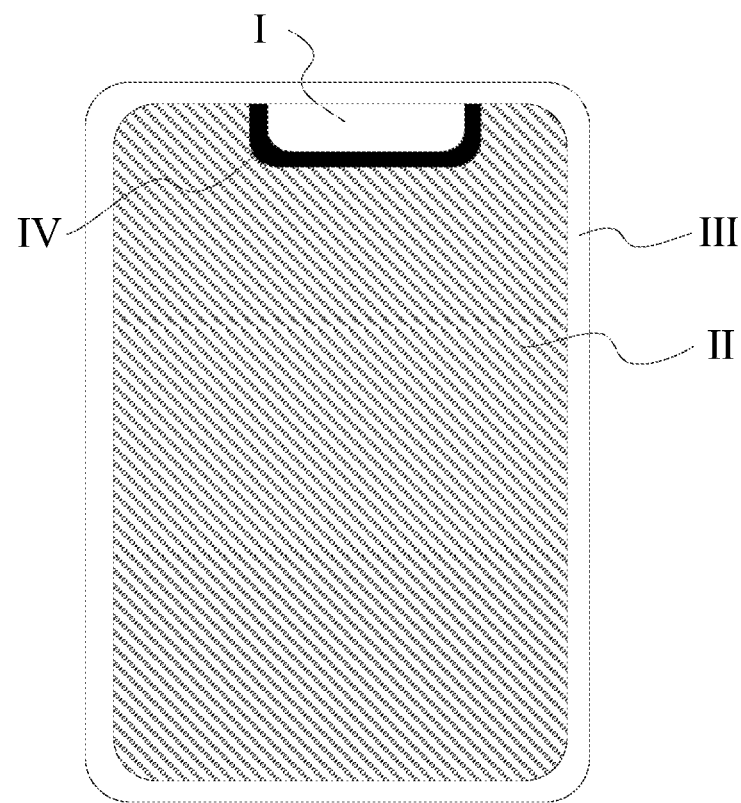
FIG. 1b is another schematic view showing positions of regions in a display substrate according to an embodiment of the present disclosure.
Figure 2:
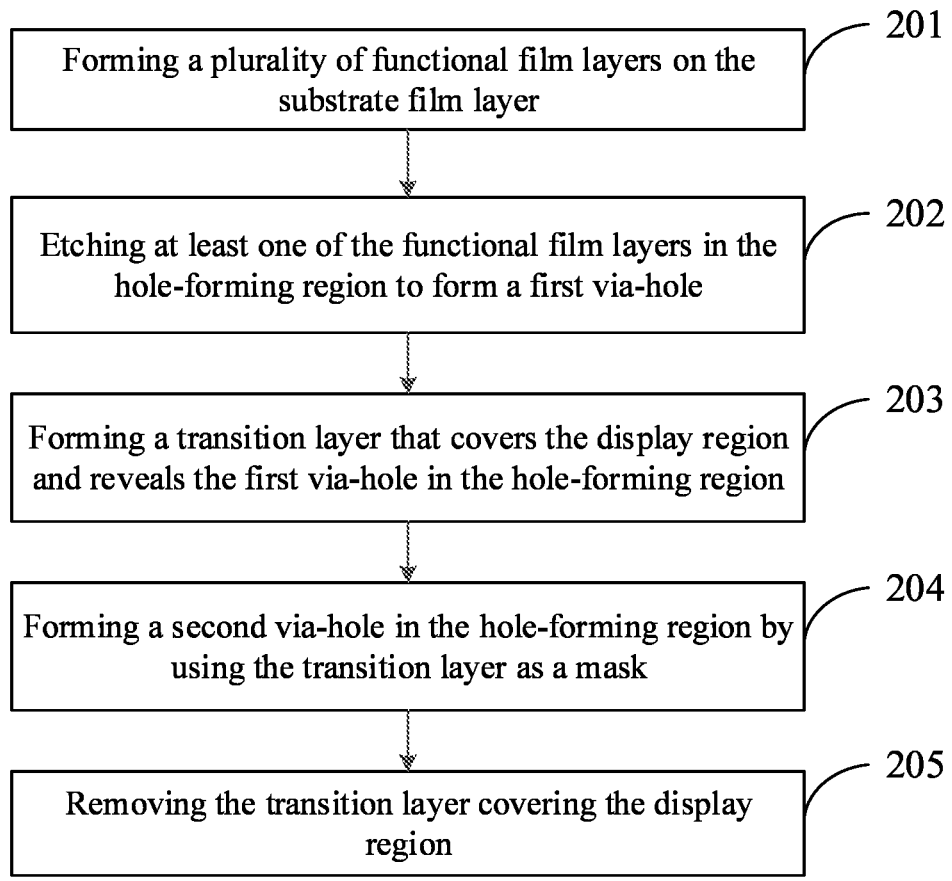
FIG. 2 is a flowchart illustrating a method for manufacturing the display substrate according to an embodiment of the present disclosure.

A method for manufacturing a display substrate is provided in an embodiment of the present disclosure. The display substrate includes a substrate film layer and functional film layers. The display substrate, as shown in FIG. 1a and FIG. 1b, includes a display region, a hole-forming region and a peripheral region, wherein the hole-forming region and the display region are surrounded by the peripheral region. As shown in FIG. 2, the method includes: a step 201 of forming a plurality of functional film layers on the substrate film layer; a step 202 of etching at least one of the functional film layers in the hole-forming region to form a first via-hole; a step 203 of forming a transition layer that covers the display region and reveals the first via-hole; a step 204 of forming a second via-hole in the hole-forming region by using the transition layer as a mask, wherein the first via-hole and the second via-hole penetrate all functional film layers and the substrate film layer; and a step 205 of removing the transition layer covering the display region.

In an embodiment of the present disclosure, after forming the plurality of functional film layers on the substrate film layer, the at least one of the functional film layers in the hole-forming region is etched to form the first via-hole. Next, the second via-hole is formed in the hole-forming region by using the transition layer as the mask, and the first via-hole and the second via-hole are connected to each other so as to penetrate all the functional film layers and the substrate film layer. In this way, it is able to avoid a case that a material for forming the plurality of functional film layers on the substrate film layer enters a hole in the substrate film layer when the hole is formed in the substrate film layer in advance, reduce a thickness of the material deposited in the hole of the substrate film layer when the manufacture of the display substrate is finished, and ensure that the thickness of the material deposited in the hole of the substrate film layer does not exceed a deep-hole cleaning capability, so as to facilitate the subsequent thorough removal of the material in the hole of the substrate film layer and facilitate the installation of a camera device. Therefore, in the technical solution of the present disclosure, it is able to ensure that the material in the second via-hole is completely removed, so as to facilitate the installation of the camera device.

In an embodiment of the present disclosure, a hole-forming region I, a display region II and a peripheral region III may be as shown in FIGS. 1a and 1b. The hole-forming region I is configured for accommodating a sensor device required by the display device, display elements used for light-emitting display are arranged in the display region II, and signal wiring connected to the display elements in the display region II are arranged in the peripheral region III.

The display region II may be arranged to completely surround the hole-forming region I, as shown in FIG. 1a, or the display region II may be arranged to partly surround the hole-forming region I, that is, the hole-forming region I is surrounded jointly by the display region II and the peripheral region III, as shown in the FIG. 1b. The hole-forming region I may be a region for installing the camera device. The functional film layers in this region are etched, so as to form a hole through which the camera device is inserted into the display substrate. The hole-forming region I may also be other regions where a hole is formed in the functional film layer. For example, in an organic light-emitting diode (OLED) flexible display device, in order to improve the stretchability of an OLED display device, the functional film layers are etched in multiple regions of the OLED flexible display device to form holes.

As shown in FIGS. 1a and 1b, the display substrate may further include a transition region IV. The transition region IV may be located between the hole-forming region I and the display region II. In the transition region IV, an isolation structure such as an isolation pillar or an isolation groove may be arranged to prevent oxygen and moisture entering through the hole-forming region I from corroding a display film layer in the display region II and ensure a proper operation of the display film layer.

It should be appreciated that, in the case that the hole-forming region I is a circular region, the transition region IV is an annular region, and in the case that the hole-forming region I is a rectangular region, the transition region IV is a rectangular frame-shaped region. In addition, as shown in FIG. 1a, when the display region II is arranged to completely surround the hole-forming region I, the transition region IV is located between the hole-forming region I and the display region II. As shown in FIG. 1b, in the case that the hole-forming region I is surrounded jointly by the display region II and the peripheral region III, a part of the transition region IV is located between the hole-forming region I and the display region II, and the other part of the transition region IV is located between the hole-forming region I and the peripheral region III. The rectangular frame-shaped region may be a rectangular frame-shaped region having rounded corners or a rectangular frame-shaped region having right-angled corners, which is not particularly limited herein.

Figure 3:
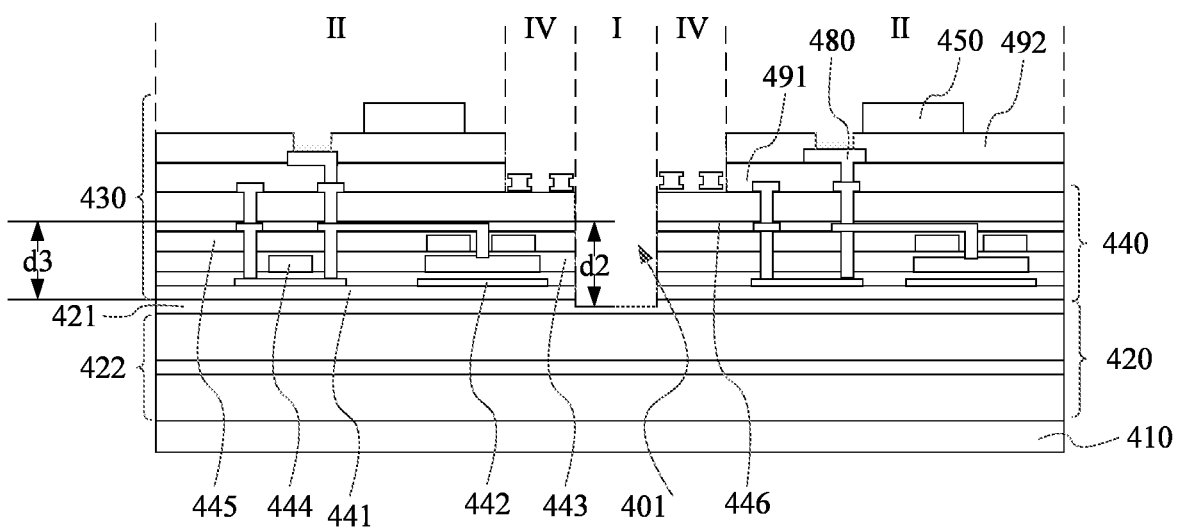
FIG. 3 is a schematic view showing a structure before forming a transition layer in the method for manufacturing the display substrate according to another embodiment of the present disclosure.

As shown in FIG. 3, the substrate film layer 420 has been formed on a carrying substrate 410 in the display substrate, and a plurality of functional film layers 430 are formed on the substrate film layer. The plurality of functional film layers 430 may include at least one of display film layers such as a thin film transistor array layer 440, a planarization layer 491, a pixel insulation layer 492, an anode 480 or a supporting pattern 450.

During the course of forming the plurality of functional film layers 430 on the substrate film layer 420, it may be the case that some functional film layers of the plurality of functional film layers 430 have their parts in the hole-forming region I removed during a patterning process, and the remaining functional film layers of the plurality of functional film layers 430 do not have their parts in the hole-forming region I removed during the patterning process. In this case, forming the first via-hole 401 by etching means an etching of at least one of the functional film layers 430 that do not have their parts in the hole-forming region I removed during the patterning process. Or, it may be the case that all the functional film layers 430 do not have their parts in the hole-forming region I removed during the patterning process. In this case, forming the first via-hole 401 by etching means an etching of at least one of the plurality of functional film layers 430.

In the embodiment of the present disclosure, after the plurality of functional film layers 430 are formed, at least one of the functional film layers 430 is etched in the hole-forming region I to form the first via-hole 401, as shown in FIG. 3. In the embodiments of the present disclosure, a number of times of etching for forming the first via-hole 401 is not particularly limited. To form the first via-hole 401, etching may be performed once, or may be performed multiple times. In the case that etching is performed multiple times, each etching may etch one or more functional film layers. A specific manner of forming the first via-hole 401 is not particularly limited in the embodiments of the present disclosure.

Figure 4:
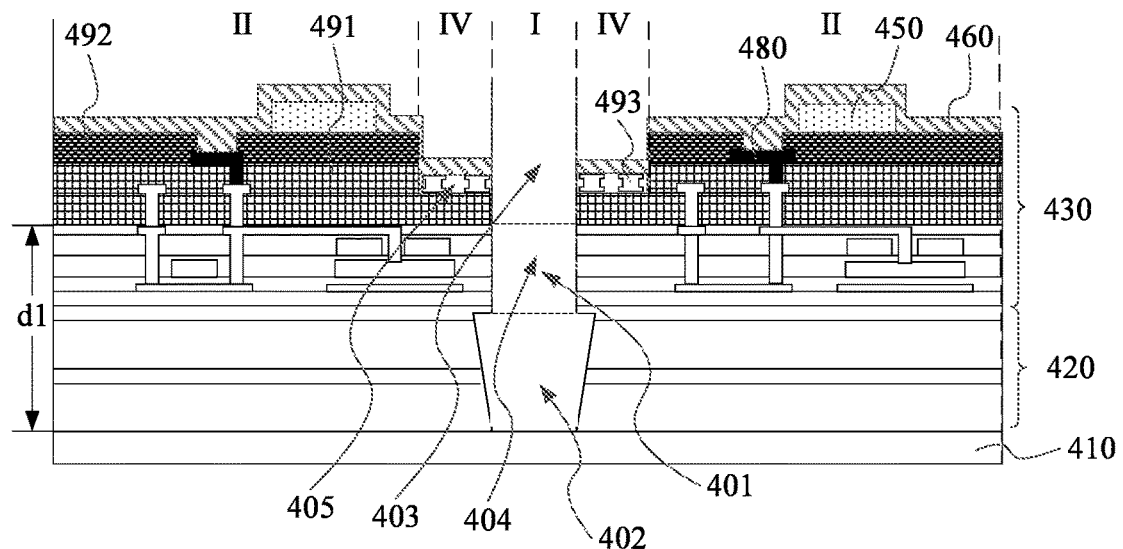
FIG. 4 is a schematic view showing a structure after forming the transition layer in the method for manufacturing the display substrate according to the another embodiment of the present disclosure.

After the first via-hole 401 is formed, as shown in FIG. 4, the transition layer 460 covering the display region II and revealing the hole-forming region I is formed. The transition layer 460 may further cover the peripheral region III, so as to protect a structure (such as an alignment mark) formed in the peripheral region III against adverse effects. The transition layer 460 may further cover the transition region IV. That is, an orthographic projection of the transition layer 460 onto the carrying substrate 410 overlaps with a non-hole-forming region (i.e., a region on the display substrate that excludes the hole-forming region I). The transition layer 460 may be formed by depositing a transition layer material uniformly (including the hole-forming region I, the display region II, the peripheral region III and the transition region IV) with the hole-forming region I being covered, and then removing the structure covering the hole-forming region I to detach the transition layer material deposited in the hole-forming region I from the transition layer material deposited in the display region II, in this way, the transition layer 460 revealing the hole-forming region I may be obtained. The transition layer 460 may also be formed in other manners, and an exact manner of forming the transition layer 460 is not limited herein.

As shown in FIG. 4, all the remaining film layers in the hole-forming region I are etched by using the transition layer 460 as a mask, so as to form the second via-hole 402 penetrating all the remaining film layers in the hole-forming region I. All the remaining film layers may be the substrate film layer remained in the case that the first via-hole 401 penetrates all the functional film layers that have been formed, or may be the functional film layers and the substrate film layer remained in the case that the first via-hole 401 only penetrates part of the functional film layers. The second via-hole 402 may be formed through a dry etching process.

Figure 5:
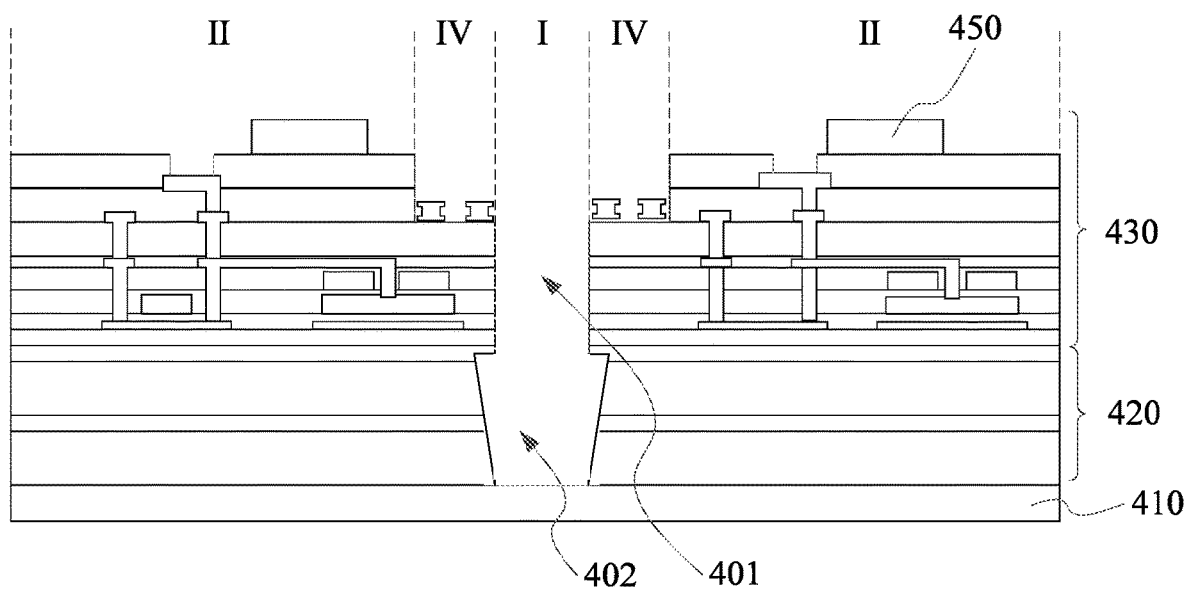
FIG. 5 is a schematic view showing a structure after forming a second via-hole in the method for manufacturing the display substrate according to the another embodiment of the present disclosure.

After the second via-hole 402 is formed, the transition layer 460 is removed, as shown in FIG. 5, so as to continue to form subsequent film layers of the display substrate. The removal of the transition layer 460 does not lead to an extra thickness of the display substrate, and does not change a layer structure of the display substrate.

Further, the forming the transition layer that covers the display region and reveals the first via-hole includes: depositing a transition material layer covering the display region and the hole-forming region; forming a photoresist on the transition material layer, exposing and developing the photoresist, to form a first photoresist pattern that covers the display region and reveals the first via-hole; etching the transition material layer in the hole-forming region by using the first photoresist pattern as a mask to form the transition layer that covers the display region and reveals the first via-hole; and removing the first photoresist pattern.

Figure 6:
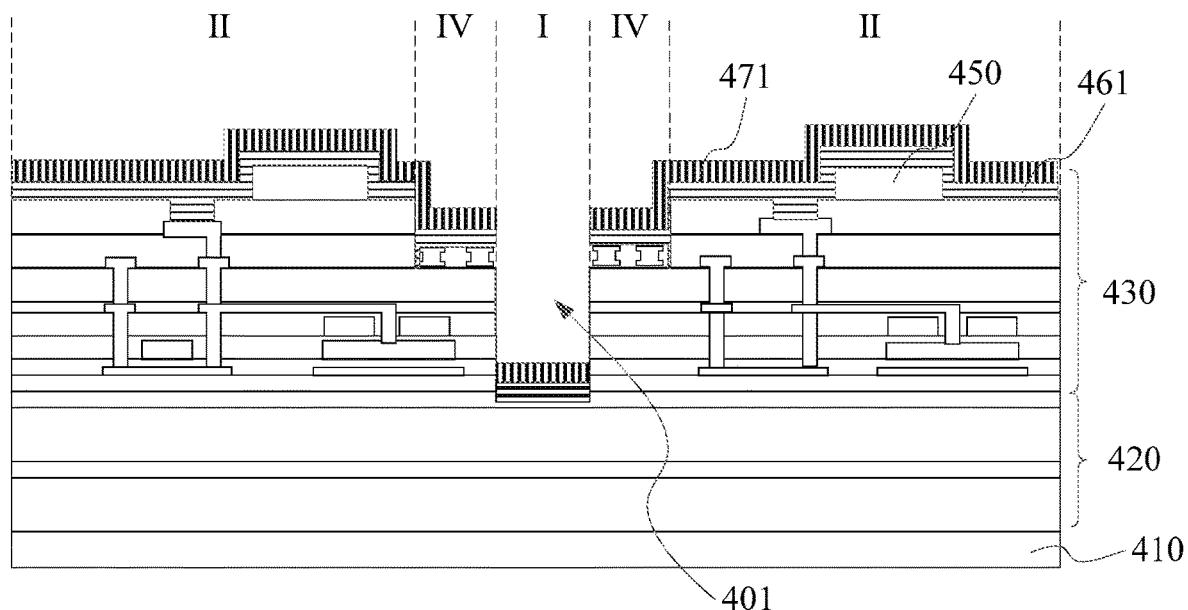
FIG. 6 is a schematic view showing a structure when a transition material layer and a photoresist are formed in the method for manufacturing the display substrate according to the another embodiment of the present disclosure.

In this embodiment, first of all, the transition layer material is deposited uniformly to obtain a transition material layer 461 covering the hole-forming region I and the display region II, as shown in FIG. 6.

Figure 7:
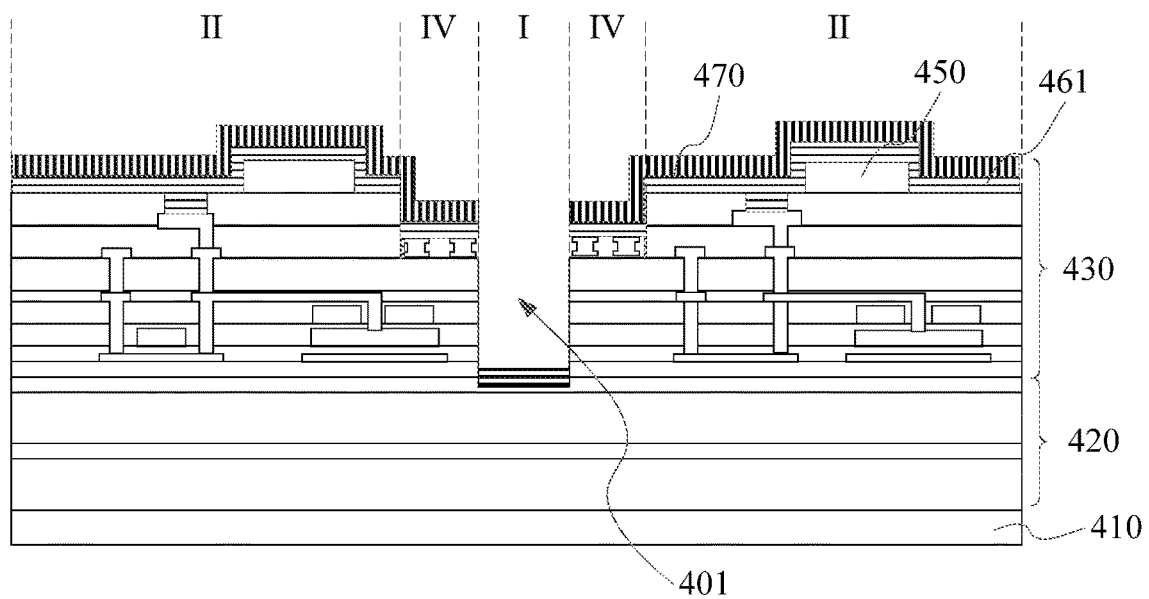
FIG. 7 is a schematic view showing a structure when the transition material layer and a first photoresist pattern are formed in the method for manufacturing the display substrate according to the another embodiment of the present disclosure.

Next, after the transition material layer 461 is formed, a photoresist 471 is applied onto the transition material layer 461. After the photoresist 471 is covered by a mask with a light-transmitting region corresponding to the hole-forming region I, a part of the photoresist 471 that is in the hole-forming region I is exposed by using ultraviolet light. After the exposure, the exposed part of the photoresist 471 is removed by using a developer to form the first photoresist pattern 470, as shown in FIG. 7.

Figure 8:
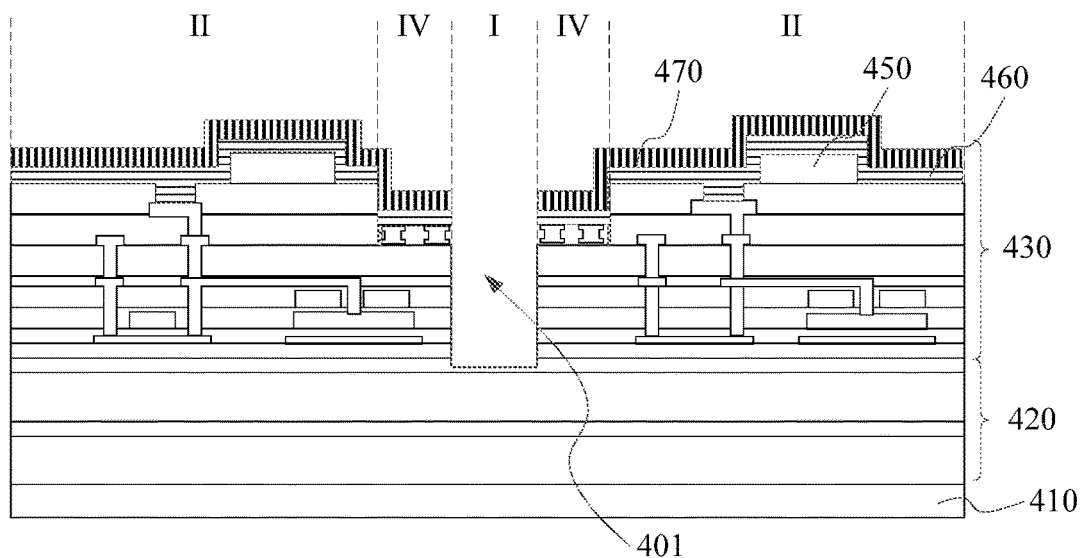
FIG. 8 is a schematic view showing a structure when the transition layer is formed and the first photoresist pattern is not removed in the method for manufacturing the display substrate according to the another embodiment of the present disclosure.

Next, a part of the transition material layer 461 that is in the hole-forming region I is etched by using the first photoresist pattern 470 as a mask, to obtain the transition layer 460 revealing the first via-hole 401 in the hole-forming region I, as shown in FIG. 8.

Figure 9:
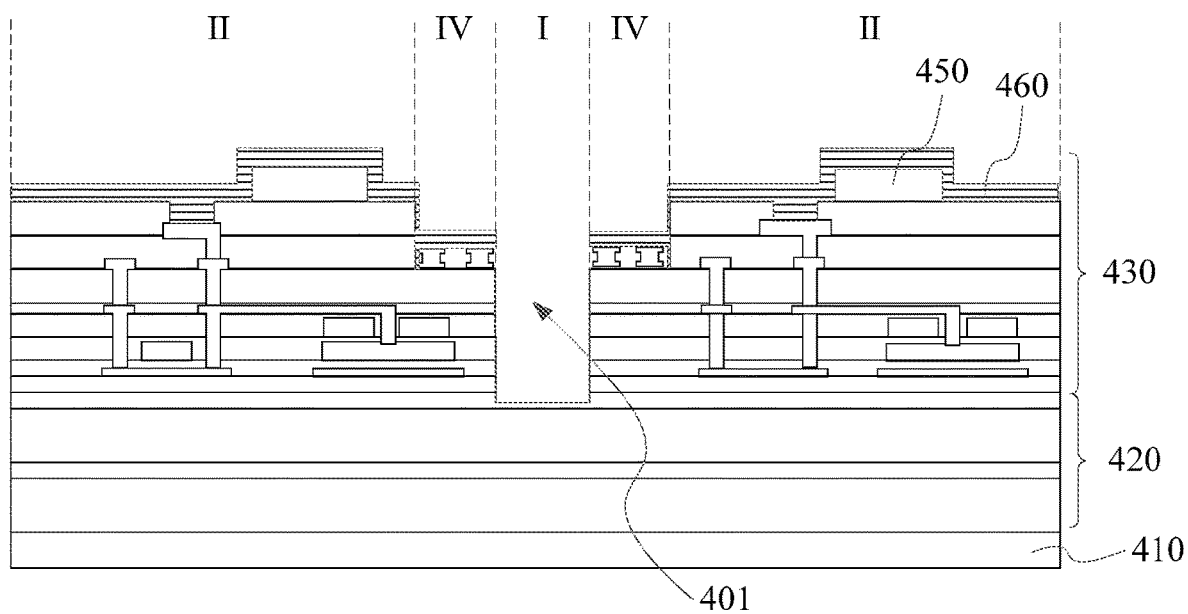
FIG. 9 is a schematic view showing a structure when the transition layer is formed and the first photoresist pattern is removed in the method for manufacturing the display substrate according to the another embodiment of the present disclosure.

Finally, the first photoresist pattern 470 is dissolved by using an etchant, as shown in FIG. 9. The etchant may be hydrogen peroxide, deionized water, etc.

Further, the transition layer 460 includes a metal layer or a metal oxide layer.

In the embodiment, a metal layer may be used as the transition layer 460, or a metal oxide layer may be used as the transition layer 460, or a mixed layer of a metal and a metal oxide may be used as the transition layer 460.

Specifically, taking the transition layer 460 including a metal oxide layer as an example, the transition layer 460 may include an indium gallium zinc oxide (IGZO) layer.

Further, the forming the plurality of functional film layers on the substrate film layer includes forming an anode on the substrate film layer; the forming the transition layer that covers the display region and reveals the first via-hole includes forming the transition layer that covers the display region and reveals the first via-hole, wherein the transition layer covers the anode; and the removing the transition layer includes etching off the transition layer by using a first etchant and leaving the anode intact.

In the embodiment, as shown in FIG. 4, before the first via-hole 401 is formed through etching, the substrate film layer 420 and the anode 480 have been formed on the carrying substrate 410, and the anode 480 is located in the display region II. The transition layer 460 formed after the first via-hole 401 is formed covers the anode 480 in the display region II.

In the embodiment, after the second via-hole 402 is formed, the transition layer 460 is etched and removed by using the first etchant, and the anode 480 is not etched during the removal of the transition layer 460, so as to ensure that a structure of display substrate is not affected adversely.

Specifically, when the transition layer 460 includes an IGZO layer and the anode 480 includes indium tin oxide (ITO), the first etchant may be a sulfuric acid solution, which only removes the IGZO layer without removing the ITO.

Further, the forming the plurality of functional film layers on the substrate film layer includes: forming a planarization material layer on the substrate film layer; and forming a pixel insulation layer covering part of the planarization material layer in the display region. The etching at least one of the functional film layers in the hole-forming region to form the first via-hole penetrating the at least one of the functional film layers includes: forming a photoresist covering the pixel insulation layer and the planarization material layer, exposing and developing the photoresist, to form a second photoresist pattern revealing the hole-forming region; etching the planarization material layer by using the second photoresist pattern as a mask to form a planarization layer and a third via-hole penetrating the planarization layer; and removing the second photoresist pattern.

In the embodiment, the plurality of functional film layers 330 formed in the display region II include a planarization layer PLN 491 and a pixel insulation layer PDL 492, as shown in FIG. 4.

The forming the plurality of functional film layers includes: depositing the planarization material layer uniformly to obtain the planarization material layer covering the hole-forming region I and the display region II, and forming a patterned pixel insulation layer 492 on the planarization material layer in the display region II.

Next, start to form the first via-hole 401. That is, after the pixel insulation layer 492 is formed, a photoresist is applied in the hole-forming region I and the display region II to cover the pixel insulation layer 492 and the planarization material layer. After the photoresist is covered by a mask with a light-transmitting region corresponding to the hole-forming region I, the part of the photoresist that is in the hole-forming region I is exposed by using ultraviolet light. After the exposure, the exposed part of the photoresist is removed by using a developer, to form the second photoresist pattern. A part of the planarization material layer that is in the hole-forming region I is etched by using the second photoresist pattern as a mask, to obtain the planarization layer 491. As shown in FIG. 4, the third via-hole 403 penetrates the planarization layer 491, and the third via-hole 403 is a part of the first via-hole 401, that is, the third via-hole 403 is a via-hole obtained through one etching in the aforementioned case of forming the first via-hole 401 by performing etching multiple times.

Finally, the second photoresist pattern is dissolved by using an etchant, and the etchant may be hydrogen peroxide, deionized water, etc.

Further, the display substrate further includes a transition region between the display region and the hole-forming region, and prior to the forming the planarization material layer on the substrate film layer, the method further includes: forming a metal pattern on the substrate film layer, where the metal pattern includes a first metal layer and a second metal layer laminated one on another in a direction perpendicular to the substrate film layer, the second metal layer is located between the first metal layer and the substrate film layer, and the first metal layer and the second metal layer are made of different metal materials. The etching the planarization material layer by using the second photoresist pattern as the mask to form the planarization layer includes: etching the planarization material layer in the transition region by using the second photoresist pattern as a mask to form an annular via-hole penetrating the planarization layer, so as to reveal the metal pattern in the transition region, the annular via hole surrounding the third via-hole and being connected to the third via-hole; and wet-etching the metal pattern in the transition region by using a second etchant to form an isolation pillar, an etching rate of the second metal layer in the second etchant being larger than an etching rate of the first metal layer in the second etchant.

In the embodiment, as shown in FIG. 4, an isolation pillar 493 is formed in the transition region IV between the display region II and the hole-forming region I, so as to prevent the moisture and oxygen entering through the hole-forming region I from corroding the display film layer in the display region II, and ensure the proper operation of the display film layer in the display region II.

Figure 10A:
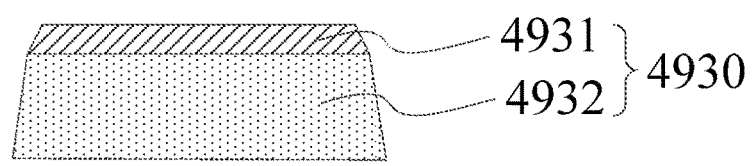
FIGS. 10a to 10c are schematic views showing a procedure of forming a type of isolation pillar in the method for manufacturing the display substrate according to the another embodiment of the present disclosure.

Specifically, the metal pattern is formed in the display region II and the transition region IV before the planarization material layer is formed. The metal pattern in the display region II may be used as a source electrode metal or a drain electrode metal in the thin film transistor array layer. The metal pattern in the transition region IV surrounds the hole-forming region I. As shown in FIG. 1a, when an outer contour of the hole-forming region I is circular, the metal pattern in the transition region IV is a metal ring. As shown in FIG. 10a, the metal pattern 4930 includes the first metal layer 4931 and the second metal layer 4932 laminated one on another in the direction perpendicular to the substrate film layer, and the first metal layer 4931 and the second metal layer 4932 are made of different metal materials, such that the second metal layer 4932 and the first metal layer 4931 experience different etching rates under a same etching condition. In the embodiment, the second metal layer is made of a material with a relatively higher etching rate, and the first metal layer 4931 is made of a material with a relatively lower etching rate.

When the planarization material layer is etched to form the planarization layer 491, in addition to the removal of the part of the planarization material layer in the hole-forming region I (to form the third via-hole 403), the part of the planarization material layer in the transition region IV is also removed (the annular via-hole 405), so as to reveal the metal pattern in the transition region IV. It should be appreciated that, the part of the planarization material layer in the transition region IV and the part of the planarization material layer in the hole-forming region I may be removed simultaneously, that is, the third via-hole 403 and the annular via-hole 405 which are connected to each other are formed simultaneously in one process.

Figure 10B:
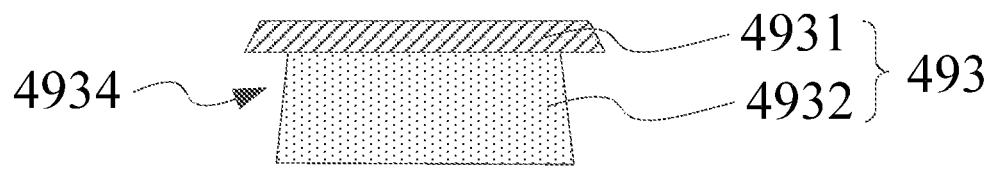
Figure 10C:
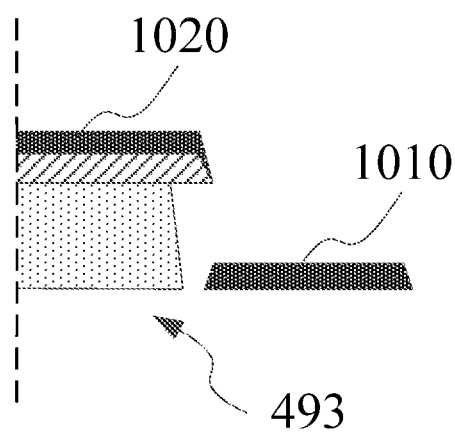

Next, the metal pattern in the transition region IV is wet-etched by using the second etchant. Since the etching rate of the second metal layer 4932 is larger than the etching rate of the first metal layer 4931, a step 4934 is gradually formed between the first metal layer 4931 and the second metal layer 4932, thereby generating the isolation pillar 493. As shown in FIG. 10b, an orthographic projection of the second metal layer 4932 in the isolation pillar 493 onto the substrate film layer is within an orthographic projection of the first metal layer 4931 onto the substrate film layer. In this way, the subsequently formed display film layer which covers the display region II and the transition region IV breaks at the isolation pillar 493 having the step 4934, that is, as shown in FIG. 10c, the portion 1010 of the display film layer that is at the isolation pillar 493 and close to the hole-forming region I is disconnected from the portion 1020 of the display film layer that is at the metal structure 493 and close to the display region II. Thus, in the case that moisture and oxygen find their way into the portion 1010 of the display film layer that is at the metal structure and close to the hole-forming region I, the moisture and oxygen can be prevented from negatively impacting the functionality of the portion 1020 of the display film layer that is at the metal structure and close to the display region II, such that the proper operation of the display film layer in the display region II is ensured.

Figure 11A:
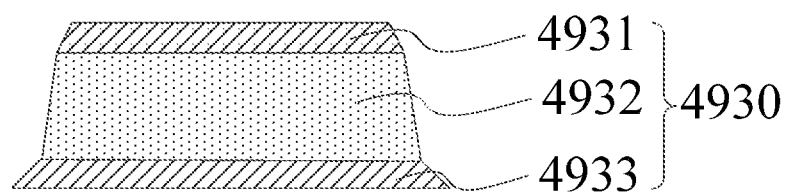
FIGS. 11a to 11c are schematic views showing a procedure of forming another type of isolation pillar in the method for manufacturing the display substrate according to the another embodiment of the present disclosure.
Figure 11B:
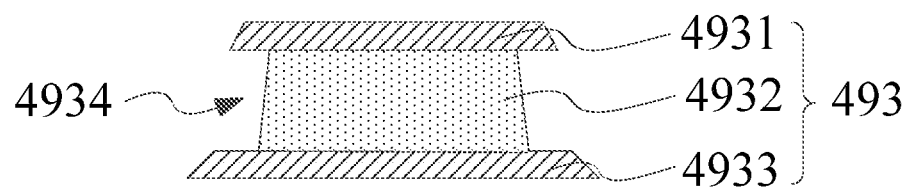
Figure 11C:
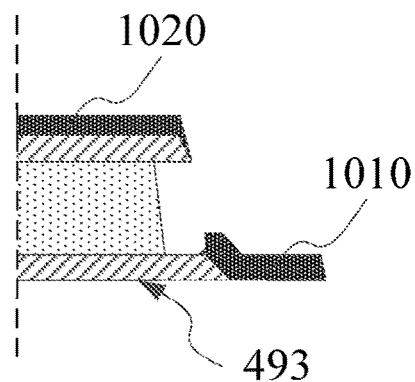

In addition, the metal pattern 4930 may also be of a three-layer structure, that is, the metal pattern 4930 includes the first metal layer 4931, the second metal layer 4932 and a third metal layer 4933 laminated one on another in the direction perpendicular to the substrate film layer, as shown in FIG. 11a. The first metal layer 4931 and the third metal layer 4933 are made of a same metal material, the first metal layer 4931 and the second metal layer 4932 are made of different metal materials, and the etching rate of the second metal layer 4932 in the second etchant is larger than the etching rate of the first metal layer 4931 and the third metal layer 4933 in the second etchant, such that a recess 4935 is gradually formed in the metal pattern to generate the isolation pillar 493, as shown in FIG. 11b. In this way, the subsequently formed display film layer which covers the display region II and the transition region IV breaks at the isolation pillar 493 having the recess 4935, that is, as shown in FIG. 11c, the portion 1010 of the display film layer that is at the isolation pillar 493 and close to the hole-forming region I is disconnected from the portion 1020 of the display film layer that is at the metal structure 493 and close to the display region II. Thus, when moisture and oxygen invades the portion 1010 of the display film layer that is at the metal structure and close to the hole-forming region I, the moisture and oxygen can be prevented from negatively impacting the functionality of the portion 1020 of the display film layer that is at the metal structure and close to the display region II, such that the proper operation of the display film layer in the display region II is ensured.

Further, prior to the forming the planarization material layer covering the display region and the hole-forming region, the method further includes: forming at least one functional film layer in the display region and the hole-forming region. Subsequent to the removing the second photoresist pattern, the method further includes: applying a photoresist covering the display region and the hole-forming region, exposing and developing the photoresist, to form a third photoresist pattern covering the display region and revealing the hole-forming region; etching the at least one functional film layer in the hole-forming region by using the third photoresist pattern as a mask, to form a fourth via-hole penetrating the at least one functional film layer, the fourth via-hole and the third via-hole being connected to each other and belonging to the first via-hole; and removing the third photoresist pattern.

That is, in the embodiment, before the planarization material layer is formed, one or more functional film layers are further formed on the substrate film layer 420, and at least one functional film layer of the functional film layers does not has its part in the hole-forming region I removed during the patterning process. These functional film layers, as shown in FIG. 3, may include at least one of a buffer layer 441, a light-shielding layer, an active layer 442, a gate insulation layer 443, a gate electrode pattern 444, an interlayer insulation layer 445, a metal layer or a passivation layer 446.

In the embodiment, after the third via-hole 403 penetrating the planarization layer 491 is formed, the at least one functional film layer of the functional film layers that does not has its part in the hole-forming region I removed during the patterning process is etched to form the fourth via-hole 404. It should be appreciated that the fourth via-hole 404 may only penetrate one functional film layer, or may penetrate multiple functional film layers, which will not be particularly limited herein.

The formed fourth via-hole 404 and the third via-hole 403 are connected to each other and both belong to the first via-hole 401, in this way, a thickness of the remaining functional film layers and substrate film layer in the hole-forming region I is a thickness of a second via-hole 402 formed subsequently. In the embodiment, a sum of a depth of the fourth via-hole 404 in the direction perpendicular to the substrate film layer 420 and a depth of the subsequently formed second via-hole 402 in the direction perpendicular to the substrate film layer 420 is equal to a spacing distance d1 between the planarization layer 491 and the carrying substrate 410 in the direction perpendicular to the substrate film layer 420, as shown in FIG. 4.

Thanks to the process of forming the fourth via-hole 404, the number of functional film layers in the hole-forming region I that need to be etched during the subsequent formation of the second via-hole 402 can be reduced, and the difficulty in forming the second via-hole 402 by etching can be reduced.

Further, as shown in FIG. 3, the substrate film layer includes a barrier layer, and the etching the at least one of functional film layers in the hole-forming region by using the third photoresist pattern as the mask to form the fourth via-hole penetrating the at least one functional film layer includes: etching the at least one functional film layer and part of the barrier layer in the hole-forming region by using the third photoresist pattern as a mask, to form the fourth via-hole.

In the embodiment, as shown in FIGS. 3 and 4, when the fourth via-hole 404 is formed, not only all the functional film layers between the substrate film layer 420 and the planarization layer 491 in the hole-forming region I are penetrated, but also a part of the barrier layer 421 is etched. In the embodiment, the depth of the fourth via-hole 404 in the direction perpendicular to the substrate film layer 420 is equal to a spacing distance d2 between the planarization layer 491 and unetched barrier layer 421 in the direction perpendicular to the substrate film layer 420. That is, the depth of the fourth via-hole 404 in the direction perpendicular to the substrate film layer 420 is larger than the spacing distance between the barrier layer and the planarization layer.

Since the barrier layer 421 is an inorganic layer, the remaining barrier layer may prevent the moisture and oxygen passing through an organic layer in other substrate film layer 422 from entering the functional film layers, and protect the functional film layers from the moisture and oxygen before the second via-hole 402 is formed. In this way, by providing the fourth via-hole 404, it is able to protect the functional film layers from the moisture and oxygen before the second via-hole 402 is formed, and reduce the number of film layers that need to be etched to form the second via-hole 402 as much as possible.

Further, prior to the forming the planarization material layer covering the display region and the hole-forming region, the method further includes: forming at least one functional film layer in the display region and the hole-forming region, and forming a target functional film layer includes: forming a material layer covering the display region and the hole-forming region; applying a photoresist onto the material layer, exposing and developing the photoresist, to form a fourth photoresist pattern revealing the hole-forming region; etching the material layer by using the fourth photoresist pattern as a mask to form a target display film layer revealing the hole-forming region, wherein the target display film layer is any one of the at least one functional film layer.

That is, in the embodiment, before the planarization material layer is formed, at least one functional film layer is further formed on the substrate film layer 420. Each of the at least one functional film layer has its part in the hole-forming region I removed during the patterning process. In this case, when the planarization layer 491 is penetrated, the first via-hole 401 penetrating the plurality of functional film layers 430 is formed.

The at least one functional film layer is formed on the substrate film layer 420, as shown in FIG. 3, the target functional film layer is at least one of the buffer layer 441, the light-shielding layer, the active layer 442, the gate insulation layer 443, the gate electrode pattern 444, the interlayer insulation layer 445, the metal layer or the passivation layer 446.

Further, subsequent to the removing the transition layer, the method further includes: forming a light-emitting layer and a cathode sequentially; and peeling the display substrate from the carrying substrate, so as to remove a material entering the second via-hole when forming the cathode and the light-emitting layer.

In the embodiment, after the transition layer 460 is removed, a channel penetrating all the substrate film layer 420 and the plurality of functional film layers 430 formed on the carrying substrate 410 has been formed in the hole-forming region I.

The light-emitting layer may be formed as follows: a light-emitting material is deposited uniformly to form the light-emitting layer, and, at this time, the light-emitting layer material is deposited in the second via-hole 402. For a formation process of the cathode, reference may be made to the formation process of the light-emitting layer, which will not be particularly described herein.

During the formation of the cathode and the light-emitting layer, materials of the cathode and the light-emitting layer are deposited on the carrying substrate 410 in the second via-hole 402. When the display substrate is subsequently peeled from the carrying substrate 410, the cathode material on the carrying substrate 410 is separated from the cathode. Similarly, the light-emitting layer material on the carrying substrate 410 is separated from the light-emitting layer, so as to remove the cathode material and light-emitting layer material in the second via-hole 402.

It should be appreciated that, the light-emitting layer material includes the light-emitting material formed in the display region and other materials formed uniformly, and the light-emitting layer material deposited in the second via-hole 402 is the other materials formed uniformly.

Figure 12:
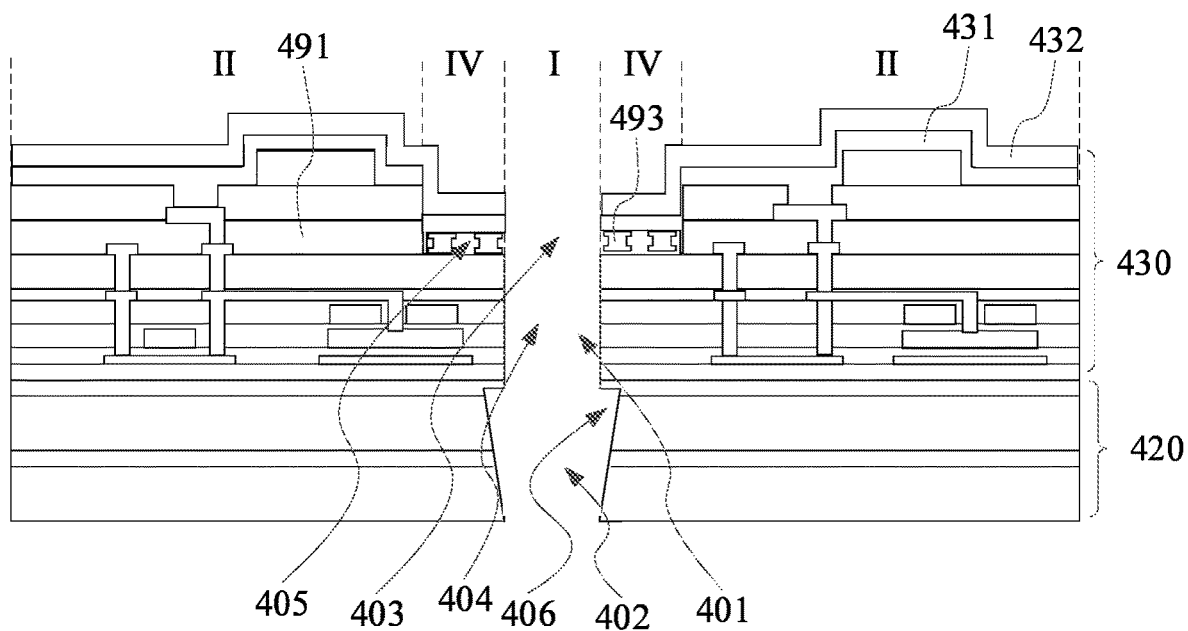
FIG. 12 is a schematic view showing a structure of the display substrate according to an embodiment of the present disclosure.

A display substrate is further provided in an embodiment of the present disclosure. As shown in FIG. 12, the display substrate includes a display region, a hole-forming region and a peripheral region surrounding the hole-forming region and the display region, the display substrate includes a substrate film layer 420 and a display film layer 430 including a plurality of functional film layers, the display substrate is provided with a first via-hole 401 and a second via-hole 402, the first via-hole 401 penetrates at least one of the functional film layers, the first via-hole 401 and the second via-hole 402 penetrate the display film layer 430 and the substrate film layer 420 of the display substrate, and an orthographic projection of the first via-hole 401 onto the substrate film layer 420 is within an orthographic projection of the second via-hole 402 onto the substrate film layer 420.

The display substrate in the embodiment of the present disclosure is manufactured by using the above-mentioned method for manufacturing the display substrate. After the first via-hole 401 is formed, the remaining functional film layers in the hole-forming region I are etched by using the transition layer 460 as a mask, so as to form the second via-hole 402 penetrating the remaining film layers. For example, the second via-hole 402 may be formed through dry etching process. An etching time may be adjusted, such that a hole size of the second via-hole 402 is larger than a hole size of the first via-hole 401, as shown in FIG. 4.

In this way, as shown in FIG. 12, a notch 406 appears at the position where the second via-hole 402 is connected to the first via-hole 401, that is, the notch appears between a sidewall of the first via-hole 401 and a sidewall of the second via-hole 402. The notch 406 has a same function as the step 4934 in FIG. 10c and the recess 4935 in FIG. 11c, namely, separating two parts of the film layer formed simultaneously, such that the part of subsequently formed light-emitting layer 431 and cathode 432 that corresponds to the substrate film layer 420 may be disconnected from the part thereof corresponding to the display film layer 430 (this part is connected to the part in the display region II), thereby preventing the moisture and oxygen from invading the light-emitting layer 431 and cathode 432 in the display region II, and ensuring that the light-emitting layer 431 and cathode 432 in the display region II operate normally.

Further, as shown in FIG. 12, a size of a first opening of the second via-hole is larger than a size of a second opening of the second via-hole, and the size of the first opening of the second via-hole is a size of an opening at an end of the second via-hole close to the display film layer, and the size of the second opening of the second via-hole is a size of an opening at an end of the second via-hole away from the display film layer In the embodiment, the second via-hole 402 is formed through a dry etching process. Since more energy is applied to the end of the second via-hole away from the substrate film layer 420, the size of the first opening of the second via-hole 402 is larger. Since less energy is applied to the end of the second via-hole close to the substrate film layer 420, the size of the second opening of the second via-hole 402 is smaller.

Further, the display film layer 430 includes a planarization layer 491, and the first via-hole 401 includes a third via-hole 403 penetrating the planarization layer 491.

In the embodiment, the first via-hole 401 is formed by performing etching multiple times.

Specifically, the process of forming the first via-hole 401 includes: after the planarization material layer and the pixel insulation layer 492 are formed, a photoresist is applied in the hole-forming region I and the display region II to cover the pixel insulation layer 492 and the planarization material layer; after the photoresist is covered by a mask with a light-transmitting region corresponding to the hole-forming region I, the photoresist in the hole-forming region I is exposed by using ultraviolet light; after the exposure, the exposed part of the photoresist is removed by using a developer to form the second photoresist pattern; a part of the planarization material layer that is in the hole-forming region I is etched off by using the second photoresist pattern as a mask, to obtain the planarization layer 491. The third via-hole 403 penetrates the planarization layer 491, is located in the hole-forming region, and is a part of the first via-hole 401.

Further, the display film layer 430 further includes other functional film layers between the planarization layer 491 and the substrate film layer 420, and the first via-hole 401 further includes a fourth via-hole 404 penetrating at least one of the other functional film layers.

Before the planarization material layer is formed, one or more other functional film layers are further formed on the substrate film layer 420, and at least one of these other functional film layers does not have its part in the hole-forming region I removed during the patterning process. The other functional film layers, as shown in FIG. 3, may include at least one of a buffer layer 441, a light-shielding layer, an active layer 442, a gate insulation layer 443, a gate electrode pattern 444, an interlayer insulation layer 445 or a passivation layer 446.

In the embodiment, after the third via-hole 403 penetrating the planarization layer 491 is formed, the at least one functional film layer that does not have its part in the hole-forming region I removed during the patterning process is further etched to form the fourth via-hole 404. It should be appreciated that the fourth via-hole 404 may only penetrate one functional film layer, or may penetrate multiple functional film layers, which is not particularly limited herein. The fourth via-hole 404 is in the hole-forming region.

The formed fourth via-hole 404 and the third via-hole 403 are connected to each other and belong to the first via-hole 401. In this way, a thickness of the remaining functional film layers and substrate film layer in the hole-forming region I is a thickness of a second via-hole 402 formed subsequently.

In the embodiment, a sum of a depth of the fourth via-hole 404 in the direction perpendicular to the substrate film layer 420 and a depth of the subsequently formed second via-hole 402 in the direction perpendicular to the substrate film layer 420 is equal to a spacing distance d1 between the planarization layer 491 and the carrying substrate 410 in the direction perpendicular to the substrate film layer 420, as shown in FIG. 4.

Thanks to the process of forming the fourth via-hole 404, the number of functional film layers in the hole-forming region I that need to be etched during the subsequent formation of the second via-hole 402 can be reduced, and the difficulty in forming the second via-hole 402 by etching can be reduced.

Further, the substrate film layer includes a barrier layer, and the fourth via-hole penetrates the other functional film layers and a part of the barrier layer.

In the embodiment, when the fourth via-hole 404 is formed, not only all the other functional film layers between the substrate film layer 420 and the planarization layer 491 in the hole-forming region I are penetrated, but also a part of the barrier layer 421 is etched.

Since the barrier layer 421 is an inorganic layer, the remaining barrier layer may prevent the moisture and oxygen passing through an organic layer in other substrate film layer 422 from entering the functional film layers, and protect the functional film layers from the moisture and oxygen before the second via-hole 402 is formed. In this way, by providing the fourth via-hole 404, it is able to protect the functional film layers from the moisture and oxygen before the second via-hole 402 is formed, and reduce the number of film layers that need to be etched to form the second via-hole 402 as much as possible.

The depth of the fourth via-hole 404 in the direction perpendicular to the substrate film layer 420 is larger than the spacing distance d3 between the barrier layer 421 and the planarization layer 491.

In the embodiment, the depth of the fourth via-hole 404 in the direction perpendicular to the substrate film layer 420 is equal to a spacing distance d2 between the planarization layer 491 and the unetched barrier layer 421 in the direction perpendicular to the substrate film layer 420, as shown in FIG. 3. That is, the depth of the fourth via-hole 404 in the direction perpendicular to the substrate film layer 420 is larger than the spacing distance d3 between the barrier layer 421 and the planarization layer 491.

Further, the display substrate further includes a transition region IV between the display region II and the hole-forming region I, and the planarization layer 491 further includes an annular via-hole 405 that penetrates the planarization layer 491 in the transition region IV, surrounds the third via-hole 403 and is connected to the third via-hole 403, an isolation pillar 493 is provided within the annular via-hole 405, as shown in FIG. 10c, the isolation pillar 493 includes a first metal layer 4931 and a second metal layer 4932 which are sequentially disposed in a direction perpendicular to the substrate film layer, the second metal layer 4932 is located between the first metal layer 4931 and the substrate film layer 430, and an orthographic projection of the second metal layer 4932 onto the substrate film layer 430 is within an orthographic projection of the first metal layer 4931 onto the substrate film layer 430.

When the planarization material layer is etched to form the planarization layer 491, in addition to the removal of the part of the planarization material layer in the hole-forming region I (to form the third via-hole 403), the part of the planarization material layer in the transition region IV is also removed (the annular via-hole 405), so as to reveal the metal pattern in the transition region IV. It should be appreciated that, the part of the planarization material layer in the transition region IV and the part of the planarization material layer in the hole-forming region I may be removed simultaneously, that is, the third via-hole 403 and the annular via-hole 405 which are connected to each other are formed simultaneously in one process.

As shown in FIG. 10b, a step 4934 is formed between the first metal layer 4931 and the second metal layer 4932, in this way, the subsequently formed display film layer which covers the display region II and the transition region IV breaks at the isolation pillar 493 having the step 4934, that is, as shown in FIG. 10c, the portion 1010 of the display film layer that is at the isolation pillar 493 and close to the hole-forming region I is disconnected from the portion 1020 of the display film layer that is at the metal structure 493 and close to the display region II. Thus, when moisture and oxygen invades the portion 1010 of the display film layer that is at the metal structure and close to the hole-forming region I, the moisture and oxygen can be prevented from negatively impacting the functionality of the portion 1020 of the display film layer that is at the metal structure and close to the display region II, such that the proper operation of the display film layer in the display region II is ensured.

In addition, the isolation pillar 493 may also be of a three-layer structure including the first metal layer 4931, the second metal layer 4932 and a third metal layer 4933 laminated one on another in the direction perpendicular to the substrate film layer, and a recess 4935 is formed in the first metal layer 4931, the second metal layer 4932 and the third metal layer 4933, so as to obtain the isolation pillar 493, as shown in FIG. 11b. In this way, the subsequently formed display film layer that covers the display region II and the transition region IV breaks at the isolation pillar 493 having the recess 4935, that is, as shown in FIG. 11c, the portion 1010 of the display film layer that is at the isolation pillar 493 and close to the hole-forming region I is disconnected from the portion 1020 of the display film layer that is at the metal structure 493 and close to the display region II. Thus, when the oxygen and moisture invades the portion 1010 of the display film layer that is at the metal structure and close to the hole-forming region I, the moisture and oxygen can be prevented from negatively impacting the functionality of the portion 1020 of the display film layer that is at the metal structure and close to the display region II, such that the proper operation of the display film layer in the display region II is ensured.

Further, the transition region is an annular region or a rectangular frame-shaped region.

In the case that the hole-forming region I is a circular region, the transition region IV is an annular region, and in the case that the hole-forming region I is a rectangular region, the transition region IV is a rectangular frame-shaped region. In addition, as shown in FIG. 1a, when the display region II is arranged to completely surround the hole-forming region I, the transition region IV is located between the hole-forming region I and the display region II. As shown in FIG. 1b, in the case that the hole-forming region I is surrounded jointly by the display region II and the peripheral region III, a part of the transition region IV is located between the hole-forming region I and the display region II, and the other part of the transition region IV is located between the hole-forming region I and the peripheral region III. The rectangular frame-shaped region may be a rectangular frame-shaped region having rounded corners or a rectangular frame-shaped region having right-angled corners, which is not particularly limited herein.

Further, the display film layer includes at least one of a buffer layer, a light-shielding layer, an active layer, a gate insulation layer, a gate electrode pattern, an interlayer insulation layer, a metal layer or a passivation layer.

Further, the isolation pillar and the metal layer are located in a same layer and are made of a same material.

Both the isolation pillar and the metal layer are located on the planarization layer, and the isolation pillar has a same layer structure as the metal layer. Specifically, when the isolation pillar includes the first metal layer and the second metal layer, the metal layer likewise includes a fourth metal layer and a fifth metal layer, the second metal layer is between the first metal layer and the substrate film layer, and the fifth metal layer is between the fourth metal layer and the substrate film layer. The first metal layer is made of a same material as the fourth metal layer, and the second metal layer is made of a same material as the fifth metal layer.

A display device including the above-mentioned display substrate is further provided in an embodiment of the present disclosure.

The display device may be a display, a mobile phone, a tablet computer, a television, a wearable electronic device, a navigation display device, etc.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is referred to as being "on" or "under" another element, it may be directly "on" or "under" the other element, or an intermediate element may exist.

The embodiments of the present disclosure are described above with reference to the accompanying drawings. However, the present disclosure is not limited to the foregoing specific implementations. The foregoing specific implementations are merely illustrative rather than limitative. In light of the teachings of the present disclosure, a person of ordinary skill in the art may further make various forms without departing from the spirit of the present disclosure and the scope of the claims, and these forms all fall within the scope of the present disclosure.

What is claimed is:

1. A method for manufacturing a display substrate, wherein the display substrate comprises a substrate film layer and functional film layers, the display substrate comprises a display region and a hole-forming region, and the method comprises:
    forming a plurality of functional film layers on the substrate film layer;
    etching at least one of the functional film layers in the hole-forming region to form a first via-hole penetrating the at least one of the functional film layers, or to form a first via-hole penetrating all the functional film layers;

forming a transition layer that covers the display region and reveals the first via-hole, wherein the transition layer comprises a metal layer or a metal oxide layer;

forming a second via-hole in the hole-forming region by using the transition layer as a mask, wherein in a case that the first via-hole penetrates the at least one of the functional film layers, the second via-hole penetrates the substrate film layer and all the functional film layers apart from the at least one of the functional film layers, or in a case that the first via-hole penetrates all the functional film layers, the second via-hole only penetrates the substrate film layer; and removing the transition layer.

2. The method according to claim 1, wherein the forming the transition layer that covers the display region and reveals the first via-hole comprises:

depositing a transition material layer covering the display region and the hole-forming region;

applying a photoresist onto the transition material layer, exposing and developing the photoresist, to form a first photoresist pattern that covers the display region and reveals the first via-hole;

etching the transition material layer in the hole-forming region by using the first photoresist pattern as a mask, to form the transition layer that covers the display region and reveals the first via-hole; and removing the first photoresist pattern.

3. The method according to claim 1, wherein the forming the plurality of functional film layers on the substrate film layer comprises:

forming an anode on the substrate film layer;

the forming the transition layer that covers the display region and reveals the first via-hole comprises:

forming the transition layer that covers the display region and reveals the first via-hole, wherein the transition layer covers the anode;

the removing the transition layer comprises:

etching off the transition layer by using a first etchant and leaving the anode intact;

wherein the transition layer is made of indium gallium zinc oxide (IGZO), the anode is made of indium tin oxide (ITO), and the first etchant is a sulfuric acid solution.

4. The method according to claim 1, wherein the forming the plurality of functional film layers on the substrate film layer comprises:

forming a planarization material layer on the substrate film layer;

forming a pixel insulation layer covering part of the planarization material layer in the display region;

the etching the at least one of the functional film layers in the hole-forming region to form the first via-hole penetrating the at least one of the functional film layers comprises:

applying a photoresist covering the pixel insulation layer and the planarization material layer, exposing and developing the photoresist, to form a second photoresist pattern revealing the hole-forming region;

etching the planarization material layer by using the second photoresist pattern as a mask, to form a planarization layer and a third via-hole penetrating the planarization layer; and removing the second photoresist pattern.

5. The method according to claim 4, wherein the display substrate further comprises a transition region between the display region and the hole-forming region, and prior to the forming the planarization material layer on the substrate film layer, the method further comprises:

forming a metal pattern on the substrate film layer, wherein the metal pattern comprises a first metal layer and a second metal layer laminated one on another in a direction perpendicular to the substrate film layer, the second metal layer is located between the first metal layer and the substrate film layer, and the first metal layer and the second metal layer are made of different metal materials;

the etching the planarization material layer by using the second photoresist pattern as the mask to form the planarization layer comprises:

etching the planarization material layer in the transition region by using the second photoresist pattern as a mask to form an annular via-hole penetrating the planarization layer, so as to reveal the metal pattern in the transition region, wherein the annular via hole surrounds the third via-hole and is connected to the third via-hole; and wet-etching the metal pattern in the transition region by using a second etchant to form an isolation pillar, wherein an etching rate of the second metal layer in the second etchant is greater than an etching rate of the first metal layer in the second etchant.

6. The method according to claim 4, wherein prior to the forming the planarization material layer covering the display region and the hole-forming region, the method further comprises:

forming at least one of the functional film layers in the display region and the hole-forming region, wherein the at least one of the functional film layers comprises at least one of a buffer layer, a light-shielding layer, an active layer, a gate insulation layer, a gate electrode pattern, an interlayer insulation layer, a metal layer or a passivation layer;

subsequent to the removing the second photoresist pattern, the method further comprises:

applying a photoresist covering the display region and the hole-forming region, exposing and developing the photoresist, to form a third photoresist pattern covering the display region and revealing the hole-forming region;

etching the at least one of the functional film layers in the hole-forming region by using the third photoresist pattern as a mask, to form a fourth via-hole penetrating the at least one of the functional film layers, wherein the fourth via-hole and the third via-hole are connected to each other and belong to the first via-hole; and removing the third photoresist pattern;

wherein the substrate film layer comprises a barrier layer, and the etching the at least one of the functional film layers in the hole-forming region by using the third photoresist pattern as the mask to form the fourth via-hole penetrating the at least one of the functional film layers comprises:

etching the at least one of the functional film layers and part of the barrier layer in the hole-forming region by using the third photoresist pattern as a mask to form the fourth via-hole;

or, wherein prior to the forming the planarization material layer covering the display region and the hole-forming region, the method further comprises:

forming the at least one of the functional film layers in the display region and the hole-forming region, wherein forming a target functional film layer comprises:
forming a material layer covering the display region and the hole-forming region;
applying a photoresist onto the material layer, exposing and developing the photoresist, to form a fourth photoresist pattern revealing the hole-forming region;
etching the material layer by using the fourth photoresist pattern as a mask to form a target display film layer revealing the hole-forming region, wherein the target display film layer is any one of the at least one of the functional film layers.

7. The method according to claim 1, wherein subsequent to the removing the transition layer, the method further comprises:
forming a light-emitting layer and a cathode sequentially; and
peeling the display substrate from a carrying substrate used for carrying the display substrate.

8. A display substrate, wherein the display substrate comprises a display region and a hole-forming region, the display substrate comprises a substrate film layer and a display film layer comprising a plurality of functional film layers, the display substrate is provided with a first via-hole and a second via-hole, the first via-hole penetrates at least one of the functional film layers, or the first via-hole penetrates all the functional film layers, in a case that the first via-hole penetrates the at least one of the functional film layers, the second via-hole penetrates the substrate film layer and all the functional film layers apart from the at least one of the functional film layers, or in a case that the first via-hole penetrates all the functional film layers, the second via-hole only penetrates the substrate film layer, and an orthographic projection of the first via-hole onto a plane where the substrate film layer is located overlaps an orthographic projection of the second via-hole onto the plane where the substrate film layer is located;
wherein the first via-hole is formed by etching the at least one of the functional film layers in the hole-forming region; and the second via-hole is formed by forming a transition layer that covers the display region and reveals the first via-hole, forming the second via-hole in the hole-forming region by using the transition layer as a mask, and removing the transition layer, wherein the transition layer comprises a metal layer or a metal oxide layer;
wherein the display film layer comprises a planarization layer, and the first via-hole comprises a third via-hole penetrating the planarization layer;
wherein the display substrate further comprises a transition region between the display region and the hole-forming region, wherein the planarization layer further comprises an annular via-hole penetrating the planarization layer in the transition region, surrounding the third via-hole and being connected to the third via-hole, an isolation pillar is provided within the annular via-hole, the isolation pillar comprises a first metal layer and a second metal layer laminated one on another in a direction perpendicular to the substrate film layer, the second metal layer is located between the first metal layer and the substrate film layer, and an orthographic projection of the second metal layer onto the substrate film layer is within an orthographic projection of the first metal layer onto the substrate film layer.

9. The display substrate according to claim 8, wherein a size of a first opening of the second via-hole is larger than a size of a second opening of the second via-hole, the size of the first opening of the second via-hole is a size of an opening at an end of the second via-hole close to the display film layer, and the size of the second opening of the second via-hole is a size of an opening at an end of the second via-hole away from the display film layer.

10. The display substrate according to claim 8, wherein the display film layer further comprises other functional film layers between the planarization layer and the substrate film layer, and the first via-hole further comprises a fourth via-hole penetrating at least one of the other functional film layers.

11. The display substrate according to claim 10, wherein the substrate film layer comprises a barrier layer, and the fourth via-hole penetrates the at least one of the other functional film layers and part of the barrier layer.

12. The display substrate according to claim 11, wherein a depth of the fourth via-hole in a direction perpendicular to the substrate film layer is larger than a spacing distance between the barrier layer and the planarization layer.

13. The display substrate according to claim 8, wherein the transition region is an annular region or a rectangular frame-shaped region.

14. The display substrate according to claim 8, wherein the display film layer comprises at least one of a buffer layer, a light-shielding layer, an active layer, a gate insulation layer, a gate electrode pattern, an interlayer insulation layer, a metal layer or a passivation layer.

15. The display substrate according to claim 14, wherein the isolation pillar and the metal layer are located in a same layer and are made of a same material.

16. The display substrate according to claim 8, further comprising a peripheral region surrounding the hole-forming region and the display region, wherein wiring connected to display elements in the display region is provided in the peripheral region.

17. A display device, comprising the display substrate according to claim 8.

18. A display substrate, wherein the display substrate comprises a display region and a hole-forming region, the display substrate comprises a substrate film layer and a display film layer comprising a plurality of functional film layers, the display substrate is provided with a first via-hole and a second via-hole, the first via-hole penetrates at least one of the functional film layers, or the first via-hole penetrates all the functional film layers, in a case that the first via-hole penetrates the at least one of the functional film layers, the second via-hole penetrates the substrate film layer and all the functional film layers apart from the at least one of the functional film layers, or in a case that the first via-hole penetrates all the functional film layers, the second via-hole only penetrates the substrate film layer, and an orthographic projection of the first via-hole onto a plane where the substrate film layer is located overlaps an orthographic projection of the second via-hole onto the plane where the substrate film layer is located;
wherein the first via-hole is formed by etching the at least one of the functional film layers in the hole-forming region; and the second via-hole is formed by forming a transition layer that covers the display region and reveals the first via-hole, forming the second via-hole in the hole-forming region by using the transition layer as a mask, and removing the transition layer, wherein the transition layer comprises a metal layer or a metal oxide layer;
wherein the display film layer is composed of the plurality of functional film layers, and the orthographic projection of the first via-hole onto the plane where the substrate film layer is located is within the orthographic projection of the second via-hole onto the plane where the substrate film layer is located.

19. The display substrate according to claim 18, wherein a size of a first opening of the second via-hole is larger than a size of a second opening of the second via-hole, the size of the first opening of the second via-hole is a size of an opening at an end of the second via-hole close to the display film layer, and the size of the second opening of the second via-hole is a size of an opening at an end of the second via-hole away from the display film layer.

20. A display device, comprising the display substrate according to claim 18.

* * * * *